(12) United States Patent
Kim et al.

(10) Patent No.: US 9,390,963 B2
(45) Date of Patent: Jul. 12, 2016

(54) SEMICONDUCTOR MEMORY DEVICE

(71) Applicant: SK hynix Inc., Gyeonggi-do (KR)

(72) Inventors: Tae Kyung Kim, Chungcheongbuk-do (KR); Hyun Yul Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/569,000

(22) Filed: Dec. 12, 2014

(65) Prior Publication Data

US 2015/0099343 A1    Apr. 9, 2015

Related U.S. Application Data

(62) Division of application No. 13/800,794, filed on Mar. 13, 2013, now Pat. No. 8,937,367.

(30) Foreign Application Priority Data

Aug. 8, 2012 (KR) ........................ 10-2012-0086886

(51) Int. Cl.
| | | |
|---|---|---|
| H01L 29/788 | (2006.01) | |
| H01L 21/764 | (2006.01) | |
| H01L 29/06 | (2006.01) | |
| H01L 27/115 | (2006.01) | |
| H01L 29/423 | (2006.01) | |

(52) U.S. Cl.
CPC ........ *H01L 21/764* (2013.01); *H01L 27/11519* (2013.01); *H01L 27/11521* (2013.01); *H01L 27/11568* (2013.01); *H01L 29/0649* (2013.01); *H01L 29/423* (2013.01)

(58) Field of Classification Search
CPC ....................... H01L 21/764; H01L 27/11521
See application file for complete search history.

(56) References Cited

U.S. PATENT DOCUMENTS

| | | | |
|---|---|---|---|
| 2012/0049266 A1* | 3/2012 | Oh | ................... H01L 21/28273 257/316 |
| 2012/0156855 A1* | 6/2012 | Sim | ................... H01L 21/76229 438/421 |
| 2012/0238099 A1* | 9/2012 | Shundo | ............... H01L 21/7682 438/703 |
| 2012/0299077 A1* | 11/2012 | Sim | ................... H01L 21/28273 257/314 |

* cited by examiner

*Primary Examiner* — Thomas L Dickey
(74) *Attorney, Agent, or Firm* — IP & T Group LLP (57) ABSTRACT

A semiconductor memory device includes a plurality of auxiliary patterns formed over a semiconductor substrate, a plurality of gate line patterns disposed in parallel with one another over the semiconductor substrate between the plurality of auxiliary patterns, and an air gap formed between the plurality of gate line patterns and between each of the plurality of gate line patterns and each of the auxiliary patterns.

9 Claims, 9 Drawing Sheets

SEMICONDUCTOR MEMORY DEVICE

CROSS-REFERENCE TO RELATED APPLICATION

This application is a division of U.S. patent application Ser. No. 13/800,794 filed on Mar. 13, 2013, which claims priority is claimed to Korean patent application number 10-2012-0086886, filed on Aug. 8, 2012. The entire disclosure of which is incorporated herein by reference in its entirety.

BACKGROUND

1. Field of Invention

Exemplary embodiments of the present invention relate to a semiconductor memory device and a method of manufacturing the same and, more particularly, to a semiconductor memory device including an air gap and a method of manufacturing the same.

2. Description of Related Art

A semiconductor memory device includes a plurality of memory cells configured to store data and devices configured to perform various operations. High-density integration techniques have become necessary to achieve a large data capacity and light weight of a semiconductor memory device. In particular, since memory cells occupy large space in a semiconductor chip, a reduction in size of the memory cells has become a concern.

Among semiconductor memory devices, a NAND flash memory device includes memory cells arranged in units of strings. Isolation layers including insulating materials are filled between these strings, i.e., at isolation regions. The isolation layers function to block electrical influence between adjacent strings, e.g., interference therebetween.

However, with increasing integration degree of the semiconductor memory device, the isolation layers including the insulating materials may have limitations in blocking interference between the strings, which may deteriorate reliability of the semiconductor memory device.

BRIEF SUMMARY

Exemplary embodiments of the present invention relate to a semiconductor memory device in which since auxiliary patterns are arranged at both ends of gate line pattern, an air gap is formed between the gate line patterns, and formed between each of the gate line patterns and each of the auxiliary patterns during subsequent processes of depositing an interlayer insulating layer, and a method of manufacturing the same.

Another exemplary embodiments of the present invention relate to a semiconductor memory device in which since adjacent gate line patterns have different lengths from each other, an air gap is formed between the gate line patterns during subsequent processes of depositing an interlayer insulating layer and an air gap is also formed to have a greater length than a shorter gate line pattern among the adjacent gate line patterns, and a method of manufacturing the same.

A semiconductor memory device according to an exemplary embodiment of the present invention may include a plurality of auxiliary patterns formed over a semiconductor substrate; a plurality of gate line patterns disposed in parallel with one another over the semiconductor substrate, and between the plurality of auxiliary patterns; and an air gap formed between the plurality of gate line patterns and formed between each of the plurality of gate line patterns and each of the plurality of auxiliary patterns.

A semiconductor memory device according to another exemplary embodiment of the present invention may include a plurality of gate line patterns disposed in parallel with one another over a semiconductor substrate; and a plurality of air gaps formed between the plurality of gate line patterns, respectively, wherein each of the plurality of gate line patterns has a different length from a gate line pattern adjacent thereto.

A method of manufacturing a semiconductor memory device according to still another exemplary embodiment of the present invention may include forming a plurality of gate line patterns over a semiconductor substrate; forming a plurality of auxiliary patterns over the semiconductor substrate, wherein the plurality of auxiliary patterns are adjacent to both ends of the plurality of gate line patterns; forming an insulating layer over an entire structure including the plurality of gate line patterns and the plurality of auxiliary patterns; and forming an air gap between each of the plurality of gate line patterns and each of the plurality of auxiliary patterns.

BRIEF DESCRIPTION OF THE DRAWINGS

FIGS. 1 to 5B are cross-sectional views and plan views of a semiconductor memory device according to an embodiment of the present invention for illustrating the semiconductor memory device;

FIGS. 8 to 12B are cross-sectional views and plan views of a semiconductor memory device according to another embodiment of the present invention for illustrating the semiconductor memory device;

DESCRIPTION OF EMBODIMENTS

Hereinafter, various embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIGS. 1 to 5B are cross-sectional views and plan views of a semiconductor memory device according to an embodiment of the present invention for illustrating a method of manufacturing the semiconductor memory device.

Figure 1:
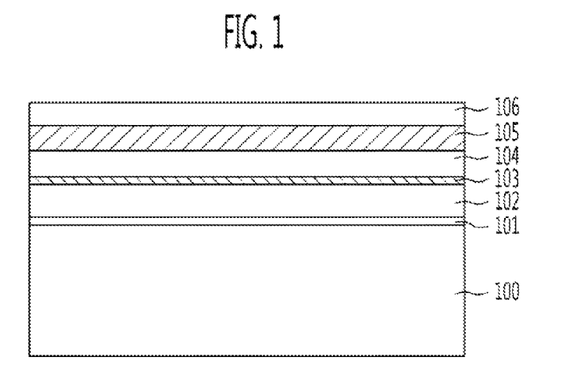

Referring to FIG. 1, a tunnel insulating layer 101 and a first conductive layer 102 configured as a floating gate may be sequentially formed over a semiconductor substrate 100 where active regions and isolation regions are defined. The tunnel insulating layer 101 may include an oxide layer. The first conductive layer 102 may include a polysilicon layer. For example, the first conductive layer 102 may include a doped polysilicon layer into which impurities are implanted, or an undoped polysilicon layer into which no impurities are implanted. Subsequently, though not illustrated in FIG. 1, isolation layers may be formed by performing a general isolation process.

Then, a dielectric layer 103, a second conductive layer 104 configured as a control gate, a metal gate layer 105 and a hard mask layer 106 may be sequentially stacked over the first conductive layer 102. The dielectric layer 103 may have an ONO structure in which an oxide layer, a nitride layer and an oxide layer are sequentially stacked on top of one another. The dielectric layer 103 may include a nitride layer and an oxide layer sequentially stacked on top of the other, or include a single layer formed of a high dielectric material. The second conductive layer 104 may include a polysilicon layer, e.g., a doped polysilicon layer. The metal gate layer 105 may include a tungsten layer or a titanium layer. The hard mask layer 106 may include any one of an oxide layer and a nitride layer, or have a dual layer structure including an oxide layer and a nitride layer.

Figure 2A:
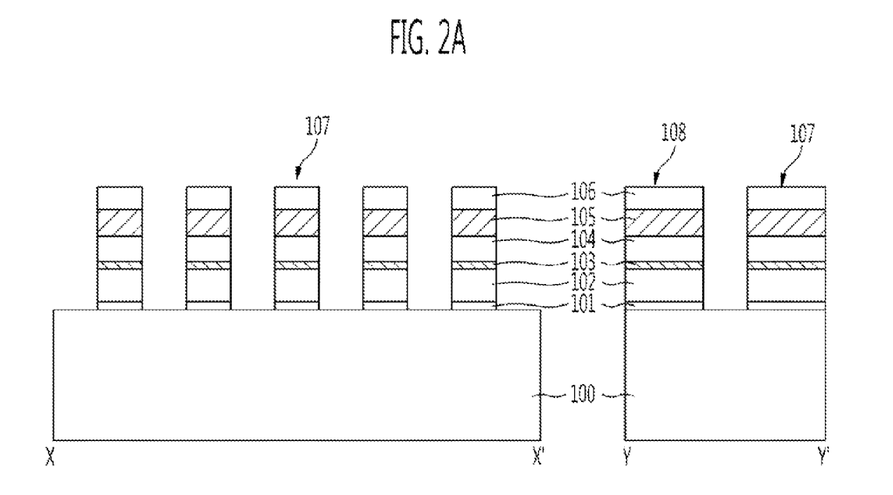

Referring to FIG. 2A, a patterning process may be performed to form gate line patterns 107 and auxiliary patterns 108. The gate line patterns 107 may be arranged in a direction crossing the isolation regions, and the auxiliary patterns 108 may be arranged at both ends of the gate line patterns 107. The gate line patterns 107 may be disposed in parallel with one another.

In FIG. 2A, X-X' refers to a direction vertical to the gate line patterns 107, i.e., a direction horizontal to the isolation regions, and Y-Y' refers to a direction horizontal to the gate line patterns 107. Referring to FIG. 2A, a region where the gate line patterns 107 are adjacent to the auxiliary pattern 108 is taken along a direction Y-Y'.

Each of the gate line patterns 107 may include the tunnel insulating layer 101, the first conductive layer 102, the dielectric layer 103, the second conductive layer 104, the metal gate layer 105 and the hard mask layer 106 that are sequentially stacked over the semiconductor substrate 100. In addition, each of the auxiliary patterns 108 arranged at both ends of the gate line patterns 107 may include the tunnel insulating layer 101, the first conductive layer 102, the dielectric layer 103, the second conductive layer 104, the metal gate layer 105 and the hard mask layer 106 that are sequentially stacked over the semiconductor substrate 100.

Subsequently, though not shown in FIG. 2A, top portions of the isolation layers of the isolation regions to be exposed may be etched so that the top portions of the isolation layers may be lower than a surface level of the tunnel insulating layer 101. In this manner, during subsequent process of forming an air gap, a surface level of the air gap may be lower than that of the tunnel insulating layer 101.

Figure 2B:
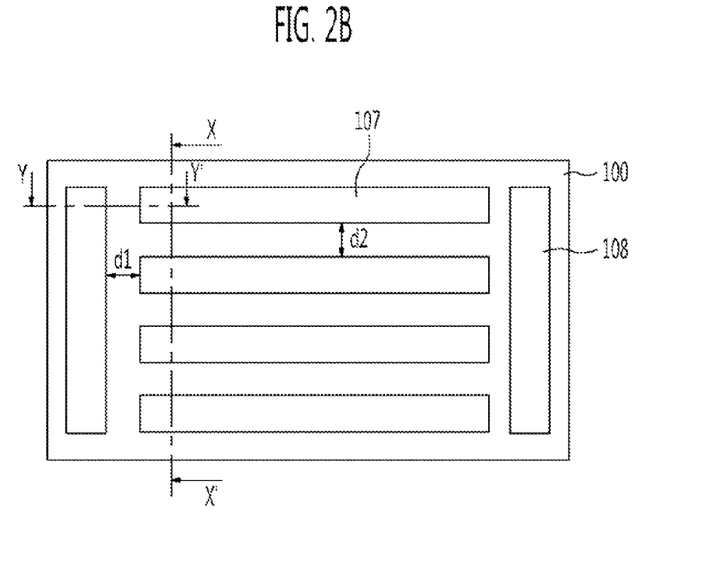

FIG. 2B is a plan view illustrating the semiconductor memory device on which the processes described above with reference to FIG. 2A is performed. Referring to FIG. 2B, the plurality of gate line patterns 107 disposed in parallel with one another over the semiconductor substrate 100 may be spaced apart from each other by a distance d2. In addition, the auxiliary patterns 108 arranged at both ends of the gate line patterns 107 may be spaced apart from both ends of the gate line patterns 107 by a distance d1, wherein the distance d2 may be substantially the same as the distance d1.

Figure 3:
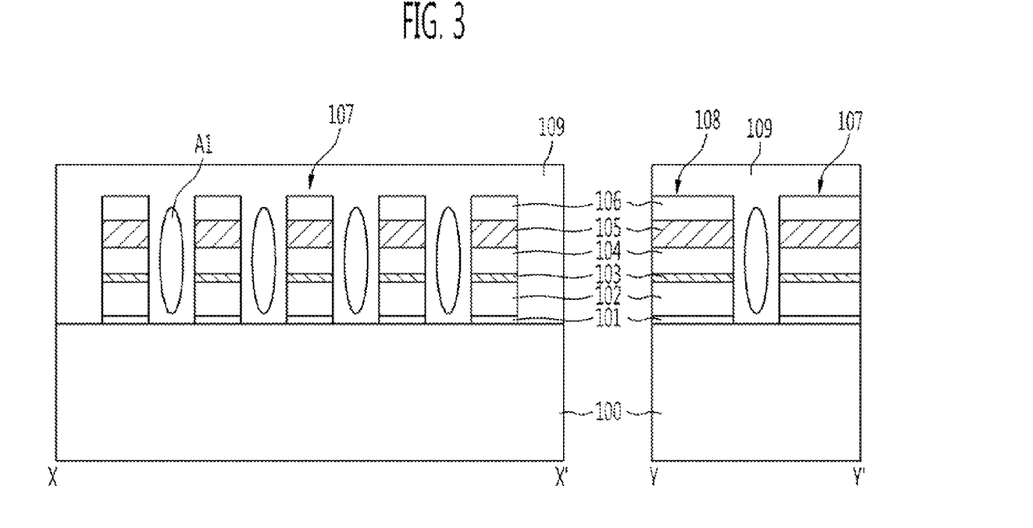

Referring to FIG. 3, a first insulating layer 109 may be formed over the entire structure including the gate line patterns 107 and the auxiliary patterns 108. The first insulating layer 109 may be a spacer insulating layer for forming spacers along sidewalls of gate line patterns configured as a select transistor, among the gate line patterns 107. When the first insulating layer 109 is formed, the gate line patterns 107 may not be completely filled with the first insulating layer 109 due to narrow spaces between the gate line patterns 107, thereby forming air gaps A1. When the first insulating layer 109 is formed between the gate line patterns 107, and formed between each of the gate line patterns 107 and each of the auxiliary patterns 108, protrusions may be formed at top portions of these patterns, which may result in the formation of the air gaps A1.

Figure 4:
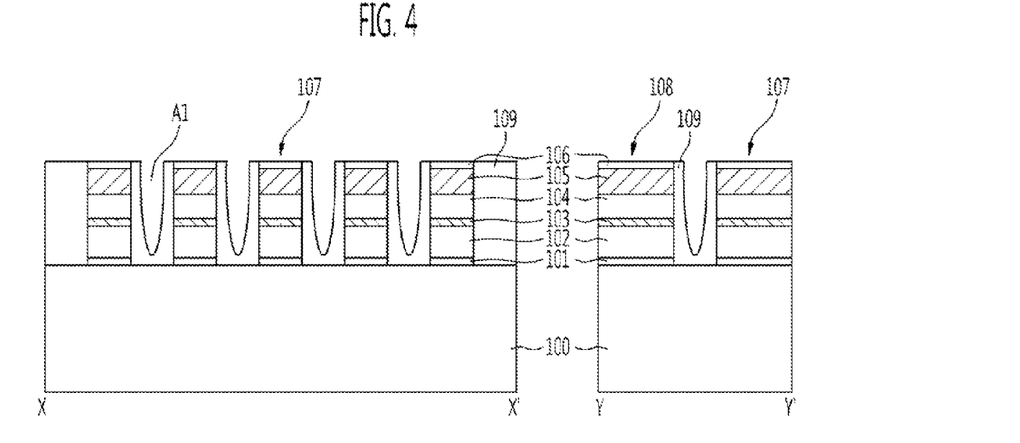

Referring to FIG. 4, an etch-back process may be performed to expose the air gaps A1 formed between the gate line patterns 107 and the air gaps A1 formed between each of the gate line patterns 107 and each of the auxiliary patterns 108. As a result, top portions of the air gaps A1 may have openings. The first insulating layer 109 may be etched using the above-described etch-back process, so that the first insulating layer 109 may remain on sidewalls of the gate line patterns 107 configured as a select transistor.

Figure 5A:
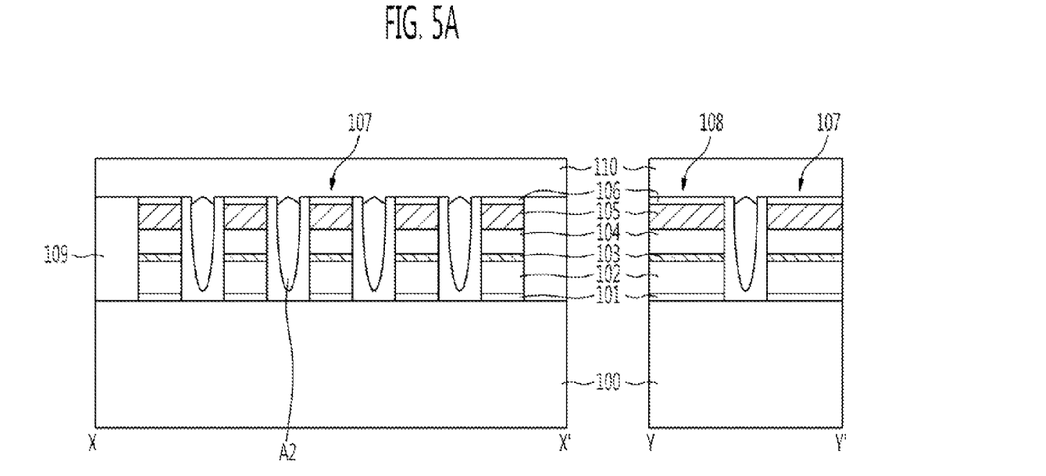

Referring to FIG. 5A, a second insulating layer 110 may be formed over the entire structure including the air gaps. The second insulating layer 110 may be an interlayer insulating layer or may include an oxide layer.

When the second insulating layer 110 is formed, the openings of the air gaps A1 formed by exposing the top portions thereof may be closed off by the second insulating layer 110.

Figure 5B:
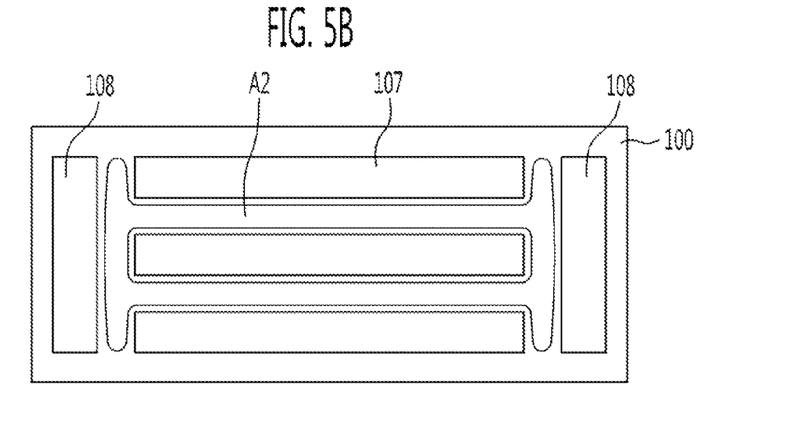

FIG. 5B is a plan view illustrating the semiconductor memory device on which the processes described above with reference to FIG. 5A have been performed. Referring to FIG. 5B, an air gap A2 may be formed between the gate line patterns 107 and between each of the gate line patterns 107 and each of the couple of auxiliary patterns 108. In other words, the air gap A2 may have a greater length than each of the gate line patterns 107. In addition, all of the remaining gate line patterns except for the outermost gate line patterns among the gate line patterns 107 may be surrounded by the air gap A2.

Figure 6:
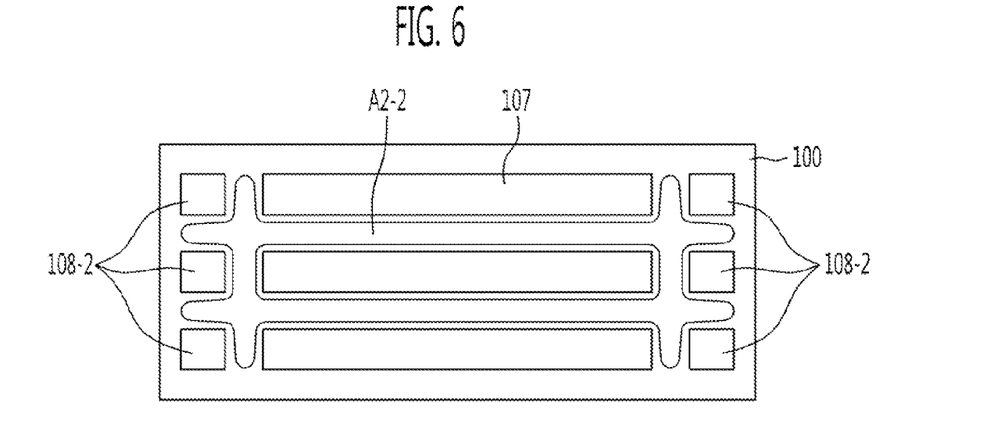
FIGS. 6 and 7 are plan view illustrating a semiconductor device with the same configuration as the semiconductor memory device of FIGS. 1 to 5B, except for changes in shape of auxiliary patterns and changes in shape of air gap.
Figure 7:
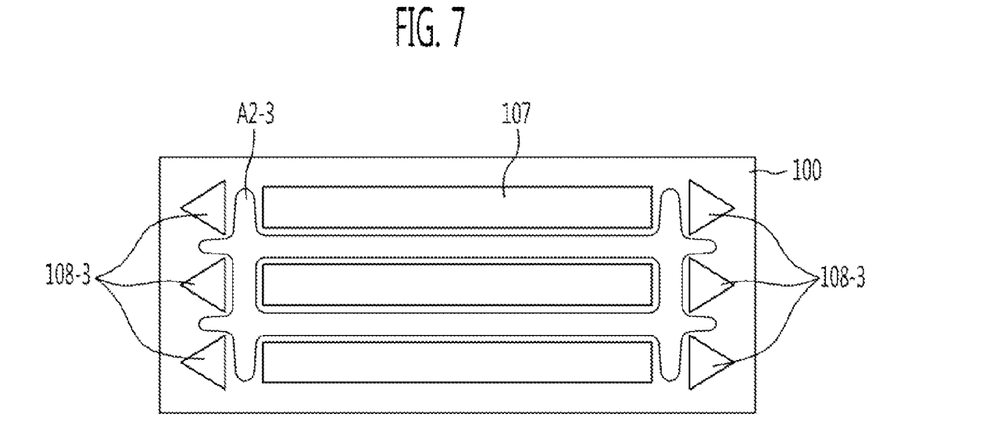

Each plan view of FIGS. 6 and 7 illustrates a semiconductor memory device with the same configuration as the semiconductor memory device of FIGS. 1 to 5B, except for changes in shape of auxiliary patterns and changes in shape of air gap.

Referring to FIG. 6, auxiliary patterns 108-2 may be formed over the semiconductor substrate 100. Any two auxiliary patterns facing each other, among the auxiliary patterns 108-2, may be disposed at both ends of each of the gate line patterns 107. An air gap A2-2 may be formed between the gate line patterns 107, and formed between each of the gate line patterns 107 and each of the auxiliary patterns 108-2, and between the auxiliary patterns 108-2. Each of the auxiliary patterns 108-2 may have a rectangular shape.

Referring to FIG. 7, auxiliary patterns 108-3 may be formed over the semiconductor substrate 100. Any two auxiliary patterns facing each other, among the auxiliary patterns 108-3, may be disposed at both ends of each of the gate line patterns 107. An air gap A2-3 may be formed between the gate line patterns 107, between the gate line patterns 107 and the auxiliary patterns 108-3, and between the auxiliary patterns 108-3. Each of the auxiliary patterns 108-3 may have a triangular shape.

As described above with reference to FIGS. 6 and 7, the auxiliary patterns may vary in shape. The auxiliary patterns may be spaced apart from both ends of the gate line patterns by a predetermined distance, respectively, so that the air gap may have a greater length than each of the gate line patterns.

As described above, according to an embodiment of the preset invention, since auxiliary patterns are arranged at both ends of gate line patterns, an air gap may be formed between the gate line patterns and between each of the gate line patterns and each of the auxiliary patterns during subsequent processes of depositing an interlayer insulating layer. In other words, the air gap may be formed in the spaces between the gate line patterns and in the spaces between each of the gate line patterns and each of the auxiliary patterns, so that electrical interference between the gate line patterns may be avoided.

FIGS. 8 to 12B are cross-sectional views and plan views of a semiconductor memory device according to another embodiment of the present invention for illustrating the semiconductor memory device.

Figure 8:
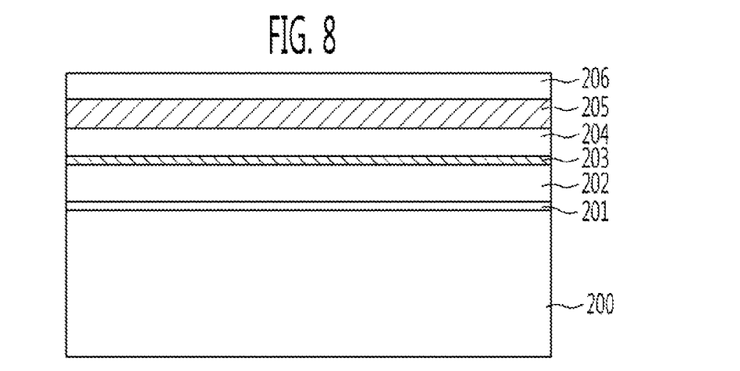

Referring to FIG. 8, a tunnel insulating layer 201 and a first conductive layer 202 configured as a floating gate may be formed over a semiconductor substrate 200 where active regions and isolation regions are defined. The tunnel insulating layer 201 may include an oxide layer. The first conductive layer 202 may include a polysilicon layer. For example, the first conductive layer 202 may include a doped polysilicon layer into which impurities are implanted, or an undoped polysilicon layer into which no impurities are implanted. Subsequently, though not illustrated in FIG. 8, a general isolation process may be performed to form isolation layers.

Subsequently, a dielectric layer 203, a second conductive layer 204 configured as a control gate, a metal gate layer 205 and a hard mask layer 206 may be sequentially formed over the first conductive layer 202. The dielectric layer 203 may have an ONO structure formed by sequentially stacking an oxide layer, a nitride layer and an oxide layer on top of one another. The dielectric layer 203 may include a nitride layer and an oxide layer sequentially stacked on top of the other, or include a single layer formed of a high dielectric material. The second conductive layer 204 may include a polysilicon layer, e.g., a doped polysilicon layer. The metal gate layer 205 may include a tungsten layer or a titanium layer. The hard mask layer 206 may include any one of an oxide layer and a nitride layer, or include a dual layer structure of an oxide layer and a nitride layer.

Figure 9A:
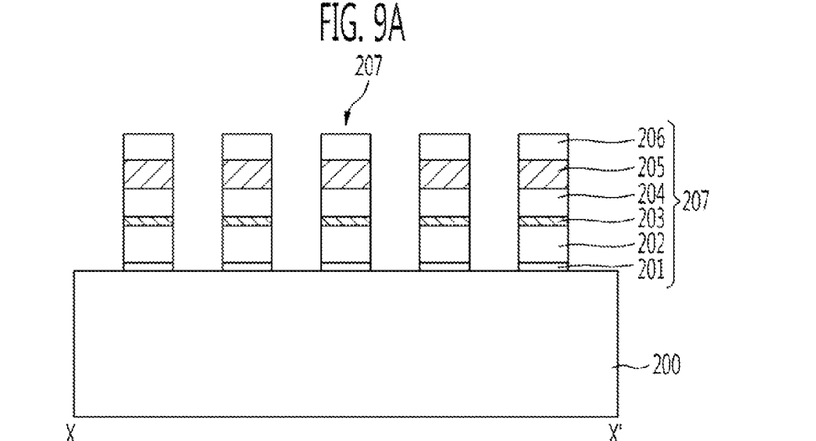

Referring to FIG. 9A, gate line patterns 207 may be formed by performing a patterning process. The gate line patterns 207 may be arranged in a direction crossing the isolation regions. In addition, the gate line patterns 207 may be disposed in parallel with one another.

In FIG. 9A, X-X' refers to a direction vertical to the gate line patterns 207, i.e., a direction horizontal to the isolation regions.

Each of the gate line patterns 207 may include the tunnel insulating layer 201, the first conductive layer 202, the dielectric layer 203, the second conductive layer 204, the metal gate layer 205 and the hard mask layer 206 that are stacked over the semiconductor substrate 200.

Subsequently, though not illustrated in FIG. 9A, top portions of isolation layers of the isolation regions to be exposed may be etched so that the top portions of the isolation layers may be lower than a surface level of the tunnel insulating layer 201. In this manner, during subsequent processes of forming an air gap, a surface level of the air gap may be lower than that of the tunnel insulating layer 201.

Figure 9B:
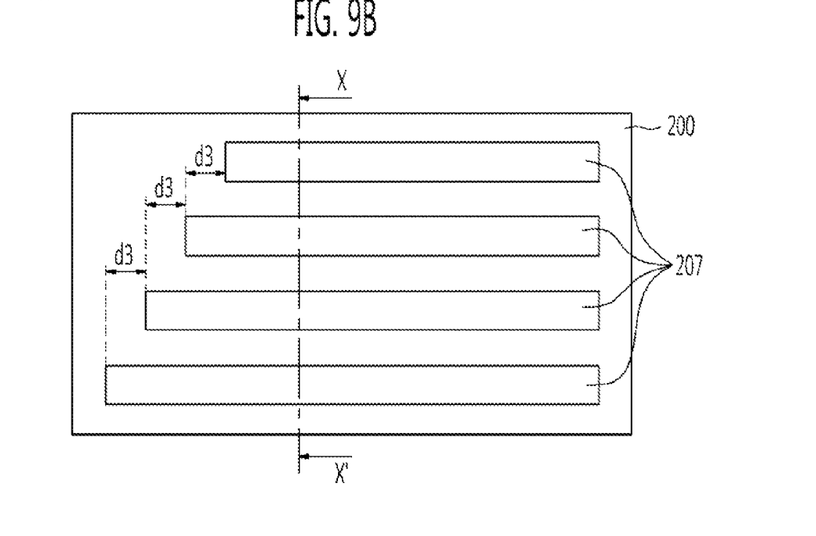

FIG. 9B is a plan view illustrating the semiconductor memory device on which the processes described above with reference to FIG. 9A have been performed. Referring to FIG. 9B, the gate line patterns 207 disposed in parallel with one another over the semiconductor substrate 200 may have different lengths from each other. In other words, each of the gate line patterns 207 may be longer or shorter than a gate line pattern adjacent thereto, by a predetermined length d3.

Figure 10:
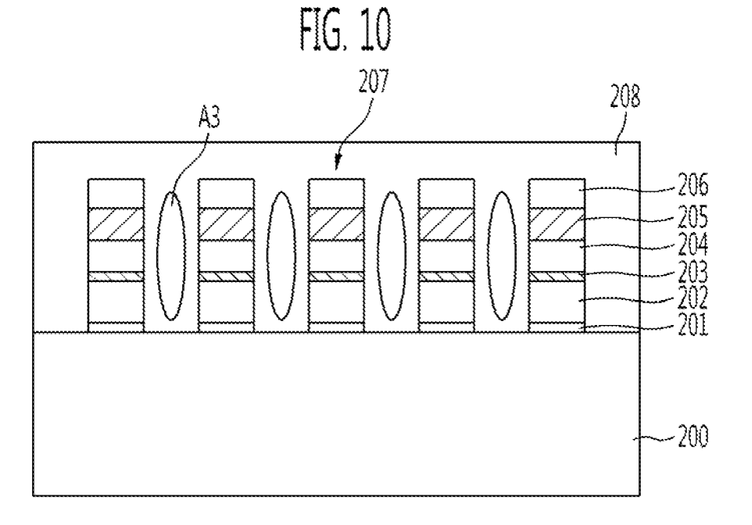

Referring to FIG. 10, a first insulating layer 208 may be formed over the entire structure including the gate line patterns 207. The first insulating layer 208 may be a spacer insulating layer for forming spacers along sidewalls of outermost gate line patterns configured as a select transistor, among the gate line patterns 207. When the first insulating layer 208 is formed, since the gate line patterns 207 are not completely filled with the first insulating layer 208 due to narrow spaces between the gate line patterns 207, of air gaps A3 may be formed. In other words, when the first insulating layer 208 is formed between the gate line patterns 207, the air gaps A3 may be formed due to protrusions that are formed at top portions of the gate line patterns 207.

Figure 11:
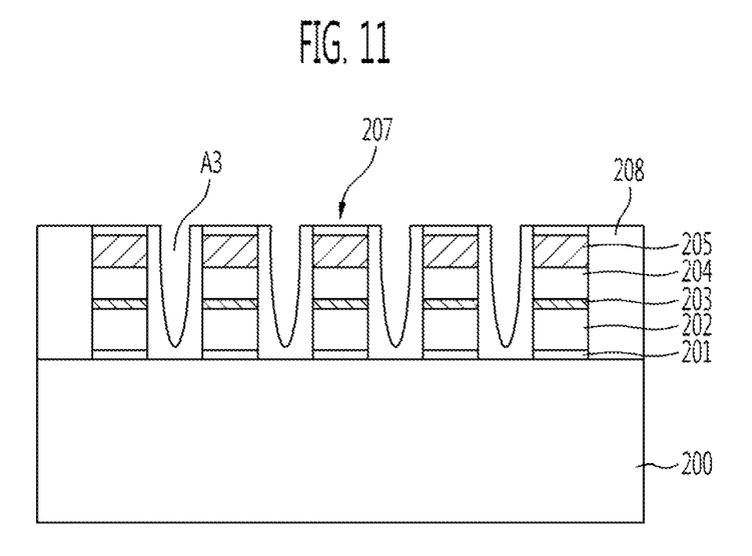

Referring to FIG. 11, an etch-back process may be performed to expose the air gaps A3 formed between the gate line patterns 207. As a result, top portions of the air gaps A3 may have openings. The first insulating layer 208 may be performed using the above-described etch-back process, so that the first insulating layer 208 may remain on sidewalls of the gate line patterns 207 configured as a select transistor.

Figure 12A:
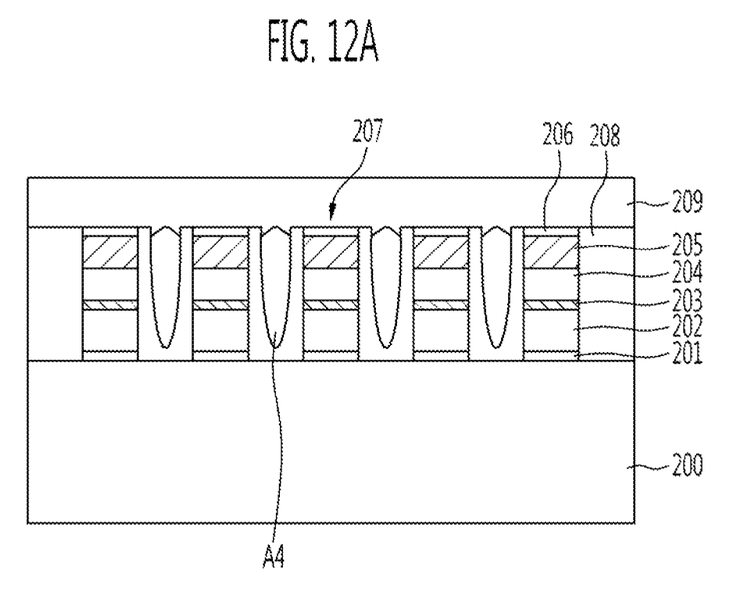

Referring to FIG. 12A, a second insulating layer 209 may be formed over the entire structure including the air gaps having the openings. The second insulating layer 209 may be an interlayer insulating Layer or may include an oxide layer.

When the second insulating layer 209 is formed, the openings of the air gaps formed by exposing the top portions thereof may be closed off by the second insulating layer 209.

Figure 12B:
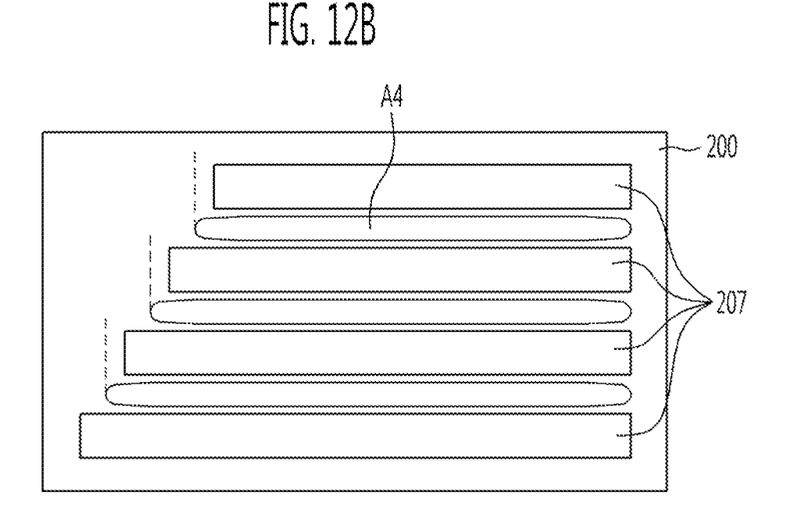

FIG. 12B is a plan view illustrating the semiconductor memory device on which the processes described above with reference to FIG. 12A have been performed. With reference to FIG. 12B, air gaps A4 may be formed between the gate line patterns 207. Each of the air gaps A4 may have a greater length than a shorter one among gate line patterns adjacent thereto.

Figure 13:
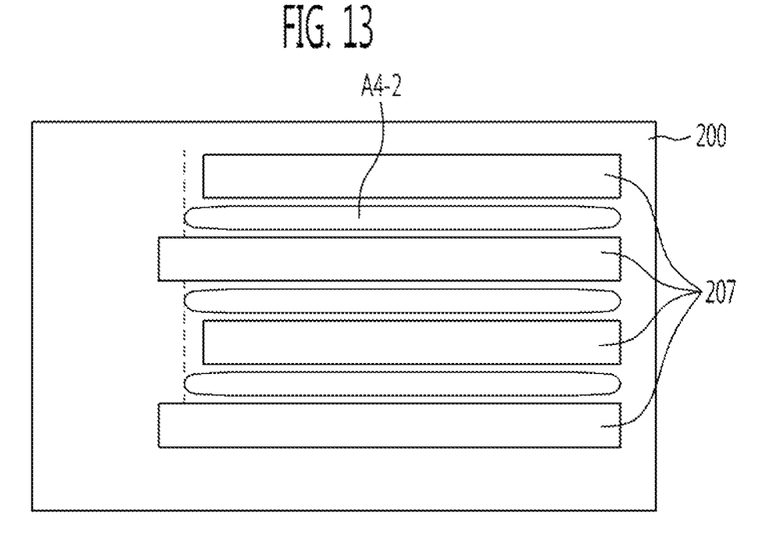
FIGS. 13 and 14 are plan views illustrating a semiconductor device with the same configuration as the semiconductor memory device of FIGS. 8 to 12B, except for changes in length of gate line patterns and in length of air gaps.
Figure 14:
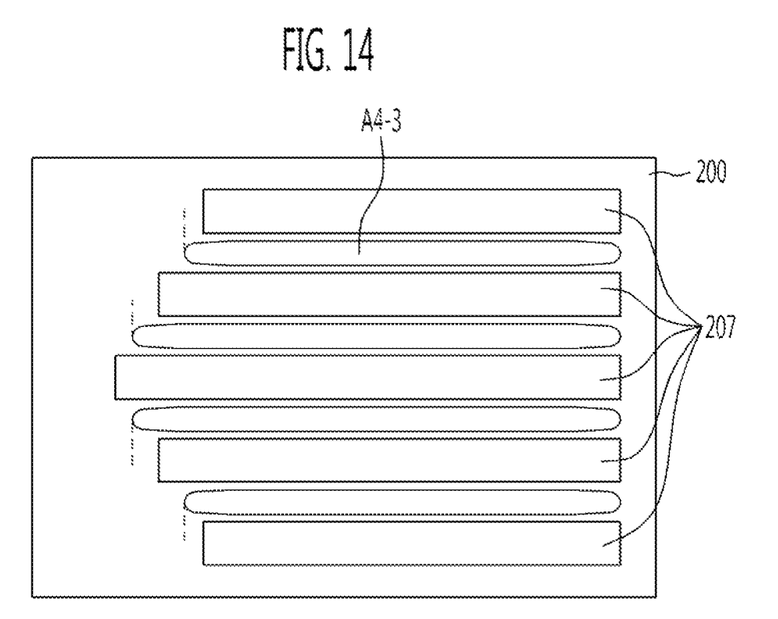

Each plan view of FIGS. 13 and 14 illustrates a semiconductor memory device with the same configuration as the semiconductor memory device of FIGS. 8 to 12B, except for changes in length of gate line patterns and in length of air gaps.

Referring to FIG. 13, among the gate line patterns 207, odd-numbered gate line patterns may be shorter than even-numbered gate line patterns. Therefore, the air gaps A4-2 formed between the gate line patterns 207 may have a greater length than the odd-numbered gate fine patterns.

As illustrated in FIG. 14, the gate line patterns 207 may gradually increase in length to a certain point and then slowly decrease in length. Therefore, for example, one of two gate line patterns adjacent to each other among the gate line patterns 207 may be longer than the other. Each of the air gaps A4-3 formed between the two adjacent gate line patterns may be longer than a shorter one among adjacent gate line patterns.

As described above, according to another embodiment of the present invention, since adjacent gate line patterns have different lengths from each other, an air gap formed between the adjacent gate line patterns may have a greater length than a shorter date line pattern, so that electrical interference between the gate line patterns may be avoided.

Figure 15:
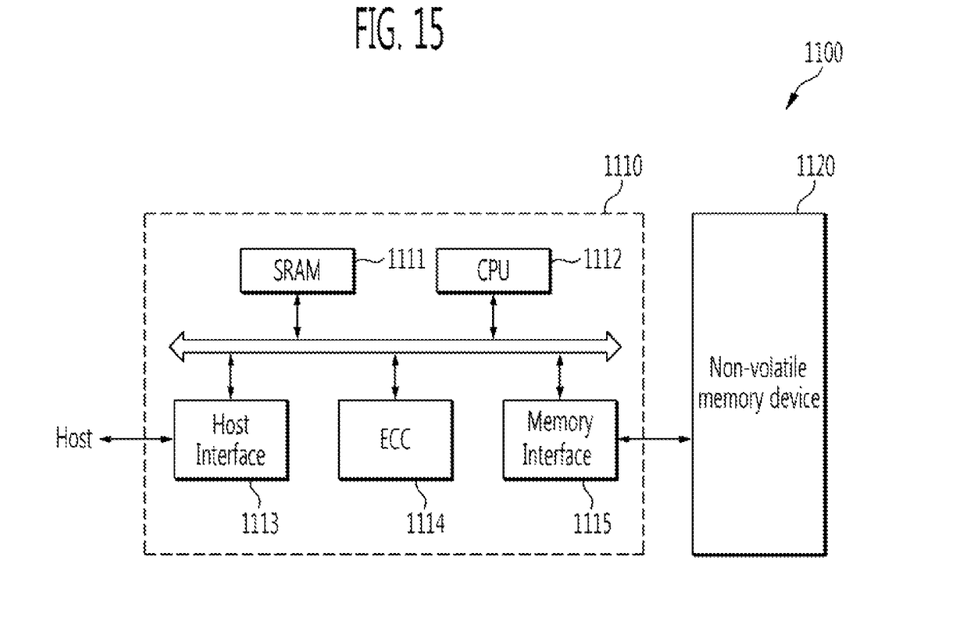
FIG. 15 is a block diagram illustrating the configuration of a memory system according to an embodiment of the present invention.

FIG. 15 is a block diagram illustrating the configuration of a memory system according to an embodiment of the present invention.

As illustrated in FIG. 15, a memory system 1100 according to an embodiment of the present invention may include a non-volatile memory device 1120 and a memory controller 1110.

The non-volatile memory device 1120 may have the semiconductor memory device described with reference to the above-described embodiments in connection with FIGS. 5B, 6, 7, 12B, 13 and 14. In addition, the non-volatile memory device 1120 may be a multi-chip package composed of a flash memory chips.

The memory controller 1110 may be configured to control the non-volatile memory device 1120. The memory controller 1110 may include SRAM 1111, a CPU 1112, a host interface 1113, an ECC 1114 and a memory interface 1115. The SRAM 1111 may function as an operation memory of the CPU 1112. The CPU 1112 may perform the general control operation for data exchange of the memory controller 1110. The host interface 1113 may include a data exchange protocol of a host being coupled to the memory system 1100. In addition, the ECC 1114 may detect and correct errors included in a data read from the non-volatile memory device 1120. The memory interface 1115 may interface with the non-volatile memory device 1120. The memory controller 1110 may further include RCM that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with the outside (e.g., a host) through one of the interface protocols including USB, MMC, PCI-E, SATA, PATH, SCSI, ESDI and IDE.

Figure 16:
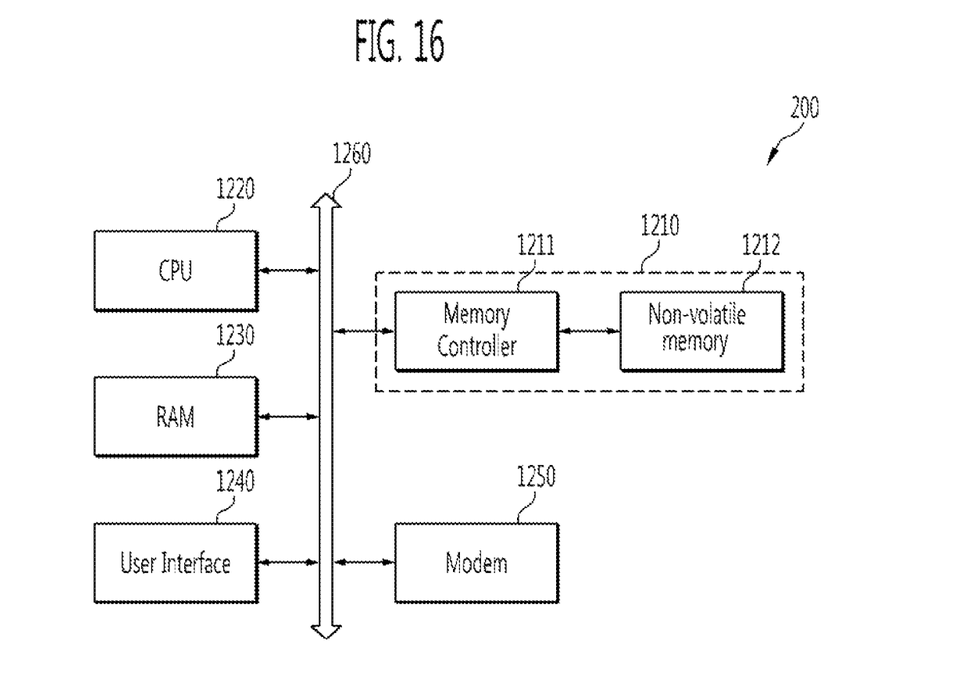
FIG. 16 is a block diagram illustrating the configuration of a memory system according to an embodiment of the present invention.

FIG. 16 is a block diagram illustrating the configuration of a computing system according to an embodiment of the present invention.

As illustrated in FIG. 16, a computing system 1200 according to an embodiment of the present invention may include a CPU 1220, RAM 1230, a user interface 1240, a modem 1250 and a memory system 1210 that are electrically coupled to a system bus 1260. In addition, when the computing system 1200 is a mobile device, a battery may be further included to apply operating voltage to the computing system 1200. The computing system 1200 may further include application chipsets, a Camera Image Processor (CIS) and mobile DRAM.

As described above in connection with FIG. 15, the memory system 210 may include a non-volatile memory 1212 and a memory controller 1211.

According to an embodiment of the present invention, an air gap may be formed between gate line patterns and between each of the gate line patterns and each of auxiliary patterns, so that electrical interference between the gate line patterns may be avoided.

In addition, according to another embodiment of the present invention, adjacent gate line patterns may have different lengths from each other, and an air gap formed between the gate line patterns may have a greater length than a shorter gate line pattern, so that electrical interference between the gate line patterns may be avoided.

While the present invention has been described with respect to the specific embodiments, it will be apparent to those skilled in the art that various changes and modifications may be made without departing from the spirit and scope of the invention as defined in the following claims.

What is claimed is:

1. A method of manufacturing a semiconductor memory device, the method comprising:
   forming a plurality of gate line patterns over a semiconductor substrate;
   forming a plurality of auxiliary patterns over the semiconductor substrate, wherein the gate line patterns are disposed between the auxiliary patterns, wherein a long axis of the gate line patterns is perpendicular to a long axis of the auxiliary patterns;
   forming an insulating layer over an entire structure including the plurality of gate line patterns and the plurality of auxiliary patterns; and
   forming an air gap between each of the plurality of gate line patterns and each of the plurality of auxiliary patterns.

2. The method of claim 1, wherein the forming of the plurality of gate line patterns and the forming of the plurality of auxiliary patterns comprise:
   forming a tunnel insulating layer, a conductive layer and a hard mask layer over the semiconductor substrate; and
   patterning the hard mask layer, the conductive layer and the tunnel insulating layer to form the plurality of gate line patterns disposed in parallel with one another and the plurality of auxiliary patterns over the semiconductor substrate, wherein the plurality of auxiliary patterns is spaced apart from both ends of the plurality of gate line patterns by a predetermined distance.

3. The method of claim 1, wherein the air gap has a greater length than each of the plurality of gate line patterns.

4. The method of claim 1, wherein all of the remaining gate line patterns except for outermost gate line patterns among the plurality of gate line patterns are surrounded by the air gap.

5. The method of claim 1, wherein the plurality of auxiliary patterns is spaced apart from both ends of the gate line patterns by a predetermined distance.

6. The method of claim 1, wherein the forming of the plurality of auxiliary patterns comprises forming a first auxiliary pattern and a second auxiliary pattern, which are disposed at both ends of the plurality of gate line patterns, respectively.

7. The method of claim 1, wherein the forming of the plurality of auxiliary patterns comprises forming a first auxiliary pattern group disposed at one end of the plurality of gate line patterns and a second auxiliary pattern group disposed at the other end of the plurality of gate line patterns, respectively,
   wherein the first auxiliary pattern group includes a plurality of first auxiliary patterns and the second auxiliary pattern group includes a plurality of second auxiliary patterns.

8. The method of claim 7, wherein the plurality of first auxiliary patterns and the plurality of second auxiliary patterns are triangular or rectangular in shape.

9. The method of claim 1, further comprising:
   etching the insulating layer to expose a top portion of the air gap, after the forming of the insulating layer, so that the air gap has an opening; and
   forming an interlayer insulating layer over the insulating layer to cover the opening of the air gap.

* * * * *